United States Patent
O'Meara et al.

(10) Patent No.: US 10,978,307 B2
(45) Date of Patent: Apr. 13, 2021

(54) DEPOSITION PROCESS

(71) Applicant: Tokyo Electron Limited, Tokyo (JP)

(72) Inventors: David O'Meara, Albany, NY (US); Eric Chih-Fang Liu, Albany, NY (US); Richard Farrell, Albany, NY (US); Soo Doo Chae, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/938,049

(22) Filed: Jul. 24, 2020

(65) Prior Publication Data

US 2021/0057226 A1 Feb. 25, 2021

Related U.S. Application Data

(60) Provisional application No. 62/889,260, filed on Aug. 20, 2019.

(51) Int. Cl.
*H01L 21/3065* (2006.01)
*H01L 21/033* (2006.01)
*H01L 21/02* (2006.01)

(52) U.S. Cl.
CPC ...... *H01L 21/3065* (2013.01); *H01L 21/0228* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 2010/0015813 A1* | 1/2010 | McGinnis | H01L 21/31608 438/771 |
| 2013/0119474 A1 | 5/2013 | Schultz | |
| 2015/0287612 A1 | 10/2015 | Luere et al. | |
| 2016/0104613 A1 | 4/2016 | Takeshita et al. | |

FOREIGN PATENT DOCUMENTS

| | | |
|---|---|---|
| KR | 101393459 B1 | 5/2014 |
| KR | 1020150053253 A | 5/2015 |

OTHER PUBLICATIONS

Korean Intellectual Property Office, The International Search Report and the Written Opinion for International application No. PCT/US2020/043427, dated Nov. 9, 2020, 16 pg.

* cited by examiner

*Primary Examiner* — Roberts P Culbert

(57) ABSTRACT

A method of patterning a substrate includes receiving a substrate having microfabricated structures, including mandrels; executing a deposition process that deposits a first material on the mandrels, the deposition process including cyclically moving the substrate through a set of deposition modules. The substrate is moved through the set of deposition modules so that the first material is deposited at a first thickness at top portions of the mandrels and at a second thickness at bottom portions of mandrels, the first thickness being greater than the second thickness. The method includes executing a spacer deposition process that conformally deposits a second material on the substrate; executing a spacer open etch that removes depositions of the second material from over a top surface of the mandrels; removing the first material and the mandrels from the substrate, leaving sidewall spacers; and transferring a pattern defined by the sidewall spacers into an underlying layer.

20 Claims, 7 Drawing Sheets

DEPOSITION PROCESS

CROSS-REFERENCE TO RELATED APPLICATIONS

This application claims the benefit of U.S. Provisional Application No. 62/889,260, filed on Aug. 20, 2019, which application is hereby incorporated herein by reference.

TECHNICAL FIELD

The present invention relates generally to a system and method for semiconductor device fabrication, and, in particular embodiments, to methods for deposition.

BACKGROUND

Generally, advancements in integrated circuit (IC) technology are driven by a demand for higher functionality at reduced cost. An IC comprises a network of electronic components and interconnect elements (e.g., transistors, resistors, capacitors, metal lines, contacts, and vias) integrated in a monolithic structure. The demand for higher functionality at reduced cost is enabled by increasing the packing density of elements of the network through miniaturization. The IC is fabricated layer-by-layer by a sequence of deposition and patterning of dielectric, metal, and semiconductor layers over a semiconductor substrate or wafer. At each successive technology node, the minimum feature sizes are reduced to reduce cost by roughly doubling the component packing density. Features of a few nanometers may be printed with innovations in direct patterning (e.g., extreme ultraviolet (EUV) and immersion lithography) and in printing at sub-resolution pitches using multiple patterning techniques. Some of these techniques use dense, high aspect ratio nanostructures. Providing the capability of forming nanostructures of accurate dimensions along with precisely controlled structural features such as edge profile, uniformly across a wide (e.g., 300 mm) wafer is a technological challenge. Successful deployment of techniques to overcome some of the hurdles in fabricating scaled semiconductor devices may need further innovations in processing methods and equipment.

SUMMARY

In accordance with an embodiment, a method of patterning a substrate includes receiving a substrate having microfabricated structures, including mandrels; executing a deposition process that deposits a first material on the mandrels, the deposition process including cyclically moving the substrate through a set of deposition modules. The set of deposition modules include modules for component process of the deposition process, where the substrate is moved through the set of deposition modules so that the first material is deposited at a first thickness at top portions of the mandrels and at a second thickness at bottom portions of mandrels, the first thickness being greater than the second thickness. The method further includes executing a spacer deposition process that conformally deposits a second material on the substrate; executing a spacer open etch that removes depositions of the second material from over a top surface of the mandrels; removing the first material and the mandrels from the substrate, leaving sidewall spacers; and transferring a pattern defined by the sidewall spacers into an underlying layer after removing the first material and the mandrels from the substrate.

In accordance with an embodiment, a method of patterning a substrate includes receiving a substrate having microfabricated structures including mandrels; executing an atomic layer deposition process that deposits a first material on the mandrels. The atomic layer deposition process includes cyclically moving the substrate through a set of atomic layer deposition modules. The set of atomic layer deposition modules include modules for component process of the atomic layer deposition process, where the substrate is moved through the set of atomic layer deposition modules at a speed that results in the first material being deposited at a first thickness at top portions of the mandrels and at a second thickness a bottom portions of mandrels, the first thickness being greater than the second thickness. The method includes executing a spacer deposition process that conformally deposits a second material on the first material; executing a spacer open etch to remove depositions of the second material from over top surfaces of the mandrels; and removing the first material and the mandrels from the substrate, leaving sidewall spacers; and transferring a pattern defined by the sidewall spacers into an underlying layer.

In accordance with an embodiment, a method for forming a device includes placing a substrate within a processing chamber, the substrate including a microfabricated structure including sidewalls and a top surface; forming a first reaction zone within the processing chamber by flowing a first precursor gas and a first isolation zone within the processing chamber by flowing an inert gas through the first isolation zone; and executing a cyclic deposition process to deposit a cap layer including a first material over the sidewalls and the top surface of the microfabricated structure by cyclically moving the substrate in a cyclic motion within the processing chamber through the first reaction zone and the first isolation zone, the depositing including having a predetermined relationship between a thickness of the cap layer along the sidewalls of the microfabricated structure with the first precursor gas, the cyclic motion of the substrate, a partial pressure of the first precursor gas in the first reaction zone, and a thickness of the cap layer over the top surface of the microfabricated structure, based on the predetermined relationship, selecting the first precursor gas, a target rate for the cyclic motion, a target partial pressure for the first precursor gas, a target deposition time for a target thickness of the cap layer over the top surface of the microfabricated structure, and depositing the cap layer, for the selected target deposition time, at the selected target rate for the cyclic motion and the selected target partial pressure of the first precursor gas.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
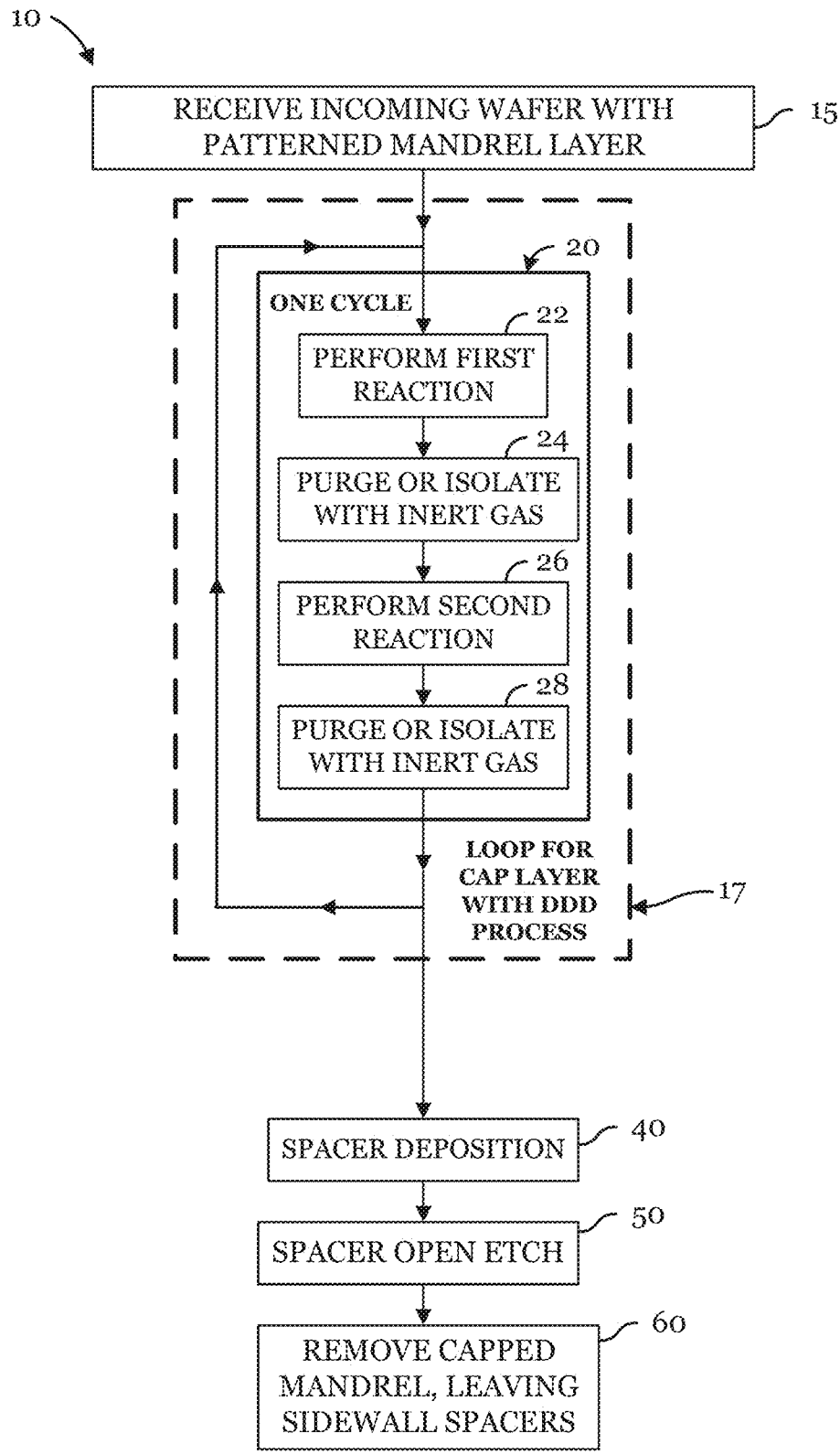
FIG. 1 is a flow diagram of a spacer etch mandrel pull process module, in accordance with an embodiment of the invention.

The embodiments in this disclosure describe methods of forming a cap layer over a patterned layer, wherein the thickness, $t_S$, of the capping material deposited along the sidewall of a feature (e.g., a line) in the patterned layer is a function of a vertical distance from a reference flat top surface of the patterned feature. The vertical distance is referred to as depth, d, and the deposition method is referred to as a depth-dependent deposition, or DDD process. One advantage provided by the DDD process is that the depth-dependence of $t_S$ may be used to adjust the slope of the sidewalls of patterned features. (Parameters d and $t_S$ are illustrated in FIG. 4B.) For example, consider a patterned layer wherein the sidewalls of a line form acute angles with the base. If, subsequently, a cap layer is formed having a progressively decreasing thickness from top to bottom along the sidewalls then the sidewall slope of the respective feature of the combined cap layer and patterned layer would be more vertical relative to the sidewall of the respective uncapped feature.

The DDD process may be useful for adjusting the sidewall slopes of patterned features in some applications where it is desirable for the patterned layer to have features with vertical sidewalls. The sidewall slope is typically characterized by a sidewall angle, θ, defined as the angle formed by the sidewall and the base of a patterned line. Accordingly, θ=90° for a vertical sidewall, θ<90° for tapered sidewalls, and θ>90° for a reentrant sidewall profile. In the embodiments in this disclosure, the cap layer thickness on the sidewalls, $t_S$, is a decreasing function of d, or the function $t_S=t_S(d)$ is decreasing with increasing d. The cap layer is thickest at the top (d=0 nm), and $t_S(o)$ is roughly the same as a target thickness, $t_T$, of the capping material deposited over the reference flat top surface. A DDD process may be used to adjust θ upwards. For example, for tapered sidewalls, the top of a line in a patterned layer is narrower than the respective base. Thus, the sidewall may be adjusted towards the vertical by forming a cap over the pattern using a DDD process whereby the cap layer on the sidewall is formed thicker towards the top relative to the base.

One application where vertical sidewalls of a patterned layer may be preferred is the spacer-etch mandrel pull (SEMP) process module used in a double (or multiple) patterning process flow, commonly referred to as the sidewall image transfer (SIT) technique. As known to persons skilled in the art, a process flow used to implement the SIT technique comprises forming spacers selectively along sidewalls of a patterned layer. In this disclosure, the DDD process has been applied to alter the shape of the sidewalls prior to forming the sidewall spacers. The terms spacer and sidewall spacer may refer to the same structure in this document.

The DDD process is described in this disclosure in the context of its application in the SEMP process module, where the DDD process is used to help provide near-vertical spacers for an SIT process. As known to persons skilled in the art, a double patterning process is a process whereby features may be patterned at half the pitch corresponding to the resolution limit of the photolithography system. In the SIT technique, a sacrificial mandrel layer is patterned at the resolution limit for pitch and sidewall spacers are formed around the mandrel lines. The patterned masking layer comprising lines at half the pitch of the resolution limit for the lithography are formed by the sidewall spacers that remain after a mandrel pull process. Generally, the mandrel pattern comprises long lines. An appropriate self-aligned spacer process may be used to form spacers along each side of the mandrel line. After the sacrificial mandrels are selectively removed, a sub-resolution half-pitch pattern of spacers remain on the substrate, and may subsequently be used as an etch mask to transfer the sub-resolution pattern to a target layer in the substrate below, thereby forming a half-pitch patterned layer comprising the target material.

FIG. 1 illustrates a flow diagram for an SEMP process module 10. As indicated in block 15, the incoming wafer has a patterned mandrel layer comprising, for example, lines patterned over a surface of a semiconductor substrate with a pitch at the resolution limit of the lithography. In this disclosure, the patterned mandrel layer of all the incoming wafers of the example SEMP process modules are assumed to have mandrel lines formed with tapered sidewalls (θ<90°). However, in some cases, the final spacer will tilt in after mandrel removal, possibly due to film stress or some other integration effect. In such cases, the ordinarily vertical mandrel (θ=90°) may require an additional top-preferential, cap deposition to form spacers with a reentrant profile (θ>90°) to compensate for the spacer tilt after mandrel removal.

A cap layer is formed over the patterned mandrel layer using a DDD process shown schematically in the dashed box 17 in the flow diagram illustrated in FIG. 1. The DDD process shown in box 17 is a cyclic or periodic deposition loop where the cap layer is formed by multiple passes through a short deposition cycle illustrated by box 20 in FIG. 1. A target thickness, $t_T$, of the capping material may be deposited over a reference flat top surface (as mentioned above) by performing a plurality of cycles, as indicated by the loop shown schematically in box 17. The depth dependence of the sidewall cap thickness, $t_S(d)$, may be obtained by creating a vertical concentration gradient of reactants along the sidewalls by adjusting appropriate processing parameters. For example, in each cycle, the exposure time of the wafer to the precursor gases may be controlled to be limited to a short duration for which there is insufficient time for the precursor gas to diffuse all the way down the sidewall to the floor and establish a uniform density of chemicals in the space between adjacent lines.

As shown in the flow diagram of the SEMP process module 10 illustrated in FIG. 1, each pass through box 20 (or, one cycle of the DDD process loop in box 17) may be, for example, similar to one reaction cycle of an atomic layer deposition (ALD) process comprising a first reaction using a first precursor gas (block 22), a first purge or isolation with an inert gas curtain (block 24), a second reaction using a second precursor gas (block 26), and a second purge or isolation with another inert gas curtain (block 28), performed successively. As known to a person skilled in the art, in one reaction cycle of an ALD process, two separate self-limiting surface reactions (separated by an inert purge or an inert isolation zone) are performed to deposit one atomic layer of the desired material covering the entire exposed surface over which the surface reactions can occur. Some ALD processes may use the single self-limiting surface reaction of the precursor component of the ALD cycle, such as silicon precursor, followed by a reactant component, such as oxygen, that is not necessarily self-limiting). In a conventional ALD process, an excess of reactants and time is provided for the reactant gases to diffuse to the entire area of the exposed surface and react with the surface atoms. Accordingly, in one reaction cycle, it may be said that one complete monolayer of the deposited material is formed over the surface. However, the amount of capping material deposited during one cycle (box 20) of the DDD process may be insufficient for forming one monolayer over the entire sidewall, starting from the reference flat top surface of the mandrel layer all the way to the floor at the base of the mandrel line. The total amount of material deposited in one reaction cycle of the DDD process may be less than the respective amount of deposited material for a complete monolayer to be formed over the surface, such as in a conventional ALD process. Accordingly, it may be said that a fraction of a complete monolayer is formed over the surface.

As described above, the DDD process parameters may be designed to create a vertical precursor concentration profile that decreases with increasing depth from the reference flat top surface of the mandrel layer. The higher density of reactants towards the top may result in a more complete surface coverage over an upper portion of the sidewalls relative to a lower portion of the respective sidewalls in each cycle (box 20) of the cap layer DDD process loop (box 17). Thus, during each pass, more material is deposited on the upper portion of the sidewalls than the lower portion of the sidewalls. Accordingly, with multiple passes through the cap layer deposition cycle (box 20), the capping material gets preferentially deposited on the upper portion of the sidewalls. The DDD process is complete when the target thickness, $t_T$, of the cap is achieved over the reference flat top surface of the mandrel layer. The respective sidewall thickness profile of the cap layer, $t_S(d)$, decreases with d, starting from a maximum top thickness, $t_S(0) \approx t_T$, as desired.

One purpose of using the DDD process loop (box 17) to form the cap layer in the example flow for the SEMP process module 10 is to adjust the tapered sidewalls of the incoming mandrels to the more vertical edge profile of the capped mandrels by applying the sidewall angle adjustment feature of the DDD process, as mentioned above. The near-vertical sidewalls of the capped mandrels get mirrored onto near-vertical edges of the respective sidewall spacers formed over the capped mandrels. As mentioned above, the patterned layer comprising these spacers is intended for use as the sub-resolution half-pitch etch mask in an SIT double-patterning process. Vertical edges are preferred for features in a patterned masking layer in order to improve the fidelity of the image transfer during the masked etch. Accordingly, incorporating the DDD process in the SEMP process module 10 provides an advantage for high-fidelity image transfer in the respective SIT double-patterning process. In some embodiments, the cap layer deposition method, for example, the ALD method may cause an erosion of the mandrel shape, causing the sidewall angle of the mandrel to change from verticality, in which case the DDD cap deposition may be used to compensate for that deposition erosion.

Embodiments of the DDD process may be implemented using, for example, a commercially available spatial atomic layer deposition (ALD) deposition system, as described in further detail below with reference to FIG. 2. As explained in further detail below, the spatial ALD system allows a convenient way to control the exposure time of a wafer to a gaseous reactant by controlling the speed with which the wafer is moved through an isolated zone containing the respective gaseous mixture comprising the precursor gas.

Still referring to FIG. 1, sidewall spacers may be formed over the capped mandrels after the DDD process loop (box 17) is complete. The surface of the floor between adjacent capped mandrels may have negligible amount of capping material formed if a selective deposition process is used to form the cap selectively over the mandrel. Even otherwise, because of the depth dependence of the deposition rate in the DDD process, the floor would have very little capping material. Generally, a surface clean step may be unnecessary after the DDD step is completed.

In block 40, a spacer layer is formed conformally over the wafer surface. The spacer layer comprises a material that may be etched selectively with an etch chemistry that is chosen for the etch to stop on the adjacent layers, such as the cap layer and the floor between adjacent mandrels. However, because the cap layer is a sacrificial layer, in some embodiments, removal rate of the spacer material during the spacer open etch (described below in reference to block 50) may not be much higher than the removal rate of the capping material. In addition, the spacer material is selected to have a sufficiently low removal rate when exposed to the etchants used in subsequent etching processes that remove the sacrificial capped mandrels. In some embodiments, the spacer deposition described by block 40 could be a continuation of the DDD process using a slower rotation rate for true ALD coverage, and a different material for integration purposes.

In block 50, a spacer open etch is performed using an anisotropic etching technique (e.g., reactive ion etching (RIE)). In a spacer open etch, the spacer material may be removed selectively from the substantially horizontal surfaces comprising the surface of the floor and the top surface of the capped mandrels, thereby forming sidewall spacers adhering to the near-vertical edges of the capped mandrels. In some embodiments, the spacer open etch may remove the capping material from the top surface and expose the top surface of the incoming mandrel layer, which would etch through any residual capping material at the substrate surface.

The SEMP process module 10 is completed in block 60 of the flow diagram illustrated in FIG. 1. In block 60, the sacrificial patterned capped mandrel layer is removed selectively, leaving behind the sub-resolution half-pitch pattern of spacers with near-vertical edges. One or more etch steps may be used to remove the capped mandrel layer. For example, in one embodiment, the capping material may be different from the material used for the tapered mandrel layer of the incoming wafer in block 15, and two etch steps using two different etchants may be used to remove the capped mandrel layer. A first etch step may remove the cap layer and a second etch step may remove the tapered mandrel layer below the cap layer. In another embodiment, the capping material may be the same as the mandrel material, and a single etchant may be used to remove the capped mandrel in a single etch step. The etchants used in block 6o may be selected to have a very low removal rate for the spacer material and the material for the floor between the mandrels so that the capped mandrels may be removed selectively. In many applications, the patterned spacer layer is used as a mask for patterning a critical dimension where high pattern quality is desired. Insufficient selectivity to the spacer material during removal of the capped mandrel layer may cause etch damage to the sub-resolution half-pitch patterned spacer layer, for example, increased line edge roughness and increased variability in spacer width. Insufficient selectivity to the floor material during removal of the capped mandrel layer may result in severe undercutting of the floor material below the spacers, resulting in defects such as deformed or toppled spacers.

Figure 2:
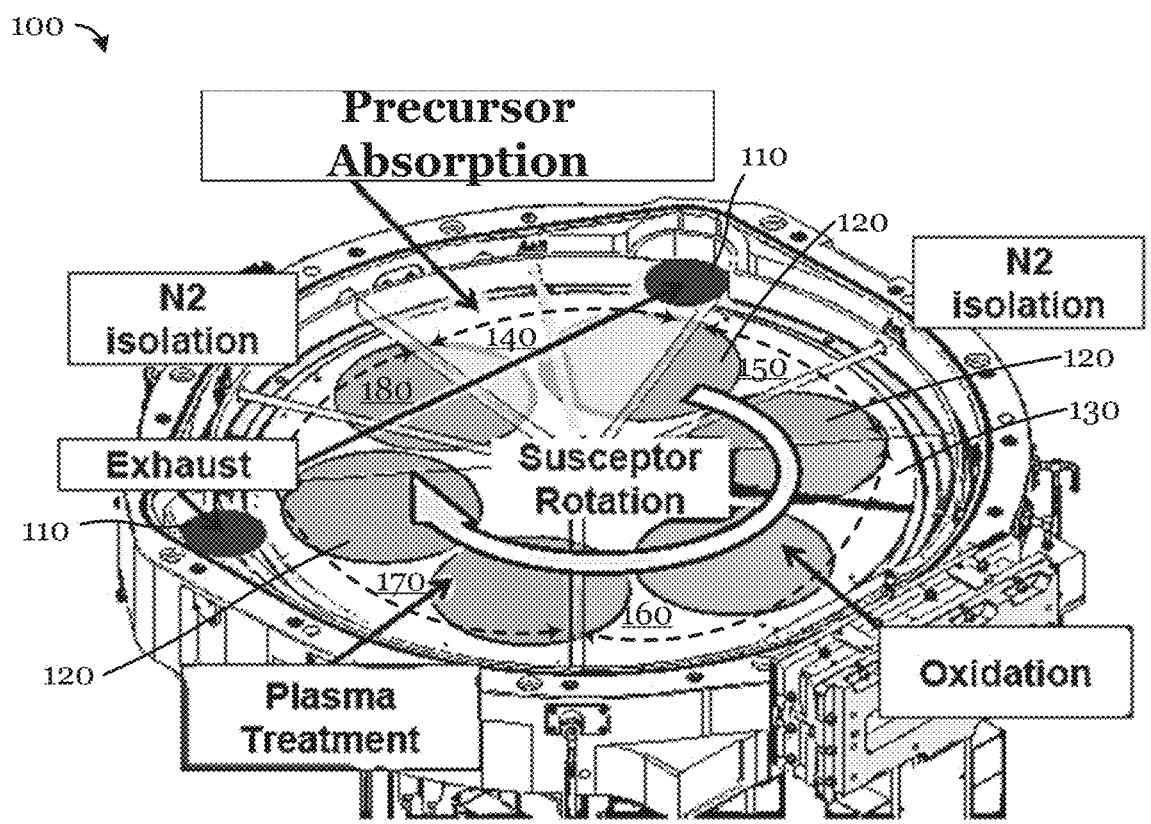
FIG. 2 is a schematic illustrating a perspective view of a semiconductor processing equipment, in accordance with an embodiment of the invention.

FIG. 2 illustrates a perspective view of a spatial ALD system 100 that may be used to perform the DDD process. As mentioned above, one method by which a higher deposition rate may be achieved closer to the top of the mandrel lines is by reducing the time available for a precursor gas to diffuse down towards the floor in one reaction step of the ALD reaction cycle. The DDD process may be implemented in the spatial ALD system 100 using this method.

As known to a person skilled in the art, ALD systems may be broadly categorized as either temporal or spatial. In temporal ALD, the reaction cycle is performed with the wafer stationary in one processing chamber. The first reaction and the second reaction of one ALD reaction cycle of a temporal ALD system are performed by introducing the respective precursor gas during temporally separated pulses, but at the same spatial location. Each ALD reaction pulse is preceded by an inert purge pulse to clear the chamber of any residual precursors and gaseous reaction byproducts.

In spatial ALD, the wafers are moved through the various gaseous mixtures in spatially separate regions or zones during processing through one ALD reaction cycle. Each gaseous mixture is substantially confined to its respective zone; hence, the zones may be described as isolated zones. The wafers are passed through an inert isolation zone before entering any one of the two reaction zones. In a spatial ALD system, the isolation zone acts as an inert gas curtain at the entrance in front of a reaction zone.

In FIG. 2, six wafers 120 are shown loaded onto a rotating susceptor 130 of the spatial ALD system 100. The wafers are moved through a first gaseous mixture comprising the first precursor gas confined to a first reaction zone 140, and through a second gaseous mixture comprising the second precursor gas confined to a second reaction zone 160.

Two inert isolation zones 150 and 180 are inserted between the two reaction zones 140 and 160, on either side of the reaction zones. The reaction zones 140 and 160 are thereby separated in space by inert isolation zones 150 and 180 instead of being separated in time by inert purge pulses for temporal ALD, as mentioned above. A gas flow system that may introduce the various gaseous mixtures in their respective zones, and a vacuum system that may remove gaseous reaction byproducts through two exhausts 110 in the reaction zones 140 and 160 are used to maintain the composition and pressure of the gases in the various zones. Independently controlled pumps may be used to allow the gaseous mixture in the first reaction zone 140 to be adjusted independent of the gaseous mixture in the second reaction zone 160.

In one embodiment, one ALD reaction cycle may be executed on a wafer 120 during one revolution of the susceptor 130. In FIG. 2, an arrow shaped as a half-circular arc indicates the direction of rotation of the susceptor. Each wafer 120 moves successively through six spatially isolated zones 140, 150, 160, 170, and 180 indicated by six dashed arcs with two arrowheads. Accordingly, in one revolution of the susceptor 130, a wafer 120 goes through the first reaction zone 140 marked as precursor absorption, followed by a nitrogen isolation zone 150 where any residual first precursor gas and gaseous reaction byproduct adhering to the wafer 120 is cleared away. The wafer 120 then enters the second reaction zone 160 where, in this example embodiment, an oxidation reaction is performed. After passing through the second reaction zone 160 the wafer 120 is moved through a plasma treatment zone 170. In some embodiments, the plasma treatment may be used for cleaning the surface before the ALD process is initiated. The plasma treatment may also be used for curing the deposited material. In some other embodiments, the plasma treatment may be optional. The wafer 120 then goes through another nitrogen isolation zone 180 to clear the surface of any residual second precursor gas and gaseous reaction byproduct before proceeding again to the first reaction zone 140. The ALD reaction cycle is repeated in this manner multiple times. The number of repetitions may be controlled in accordance to a target thickness for the reference flat top surface specified in the respective process recipe. Generally, the thickness of the cap layer on the reference flat top surface is roughly proportional to a product of the processing time and the rotational speed of the susceptor 130.

In one embodiment, the DDD process is implemented by selecting the duration for which the wafer 120 is exposed to the first precursor in one reaction cycle. In the spatial ALD system 100 described above, the duration for which the wafer 120 is exposed to the first precursor in one reaction cycle is the time taken by a wafer 120 to pass through the first reaction zone 140. The time taken by a wafer 120 to pass through the first reaction zone 140 is roughly inversely proportional to the rotational speed of the susceptor 130. Accordingly, the DDD process may be implemented by adjusting the rotational speed of the susceptor to an appropriate value.

Although a rotational movement is shown in FIG. 2, in alternative embodiments, a periodic oscillation (e.g., bidirectional motion) of the wafer may produce a similar effect. In such an embodiment, the wafer could be translated from one spatially isolated zone to another during one half cycle while repeating the same in the opposite direction during the other half cycle.

A hypothetical SEMP process module having ideal vertical mandrel edge profiles is illustrated by the cross-sectional views in FIGS. 3A-3D. The hypothetical SEMP process module may be compared with an example embodiment of the SEMP process module 10 incorporating the sidewall angle adjustment technique, described above with reference to FIGS. 1 and 2. The example embodiment of the SEMP process module 10 is described with reference to FIGS. 4A-4E.

Figure 3A:
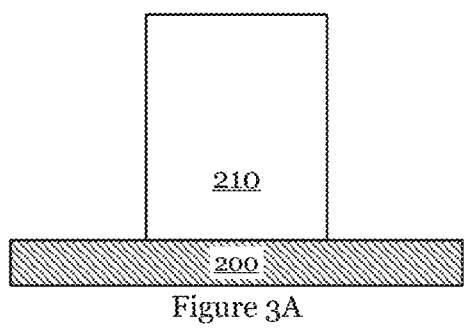
FIGS. 3A-3D illustrate cross-sectional views of a semiconductor device at various intermediate stages of a hypothetical spacer etch mandrel pull process flow.
Figure 4A:
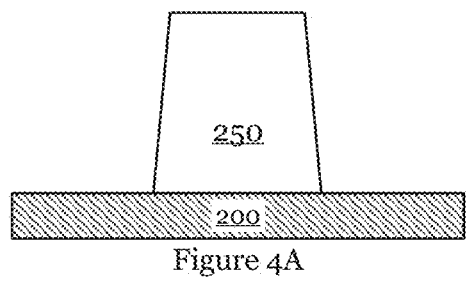
FIGS. 4A-4E illustrate cross-sectional views of a semiconductor device at various intermediate stages of a spacer etch mandrel pull process flow, in accordance with an embodiment of the invention.
Figure 4B:
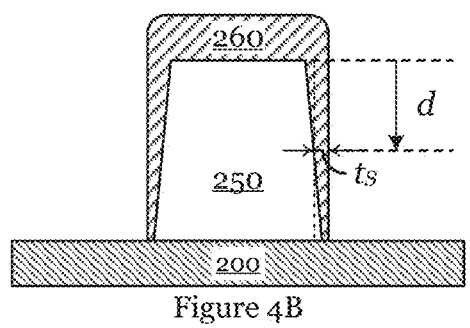

FIG. 3A shows a hypothetical ideal incoming wafer and FIG. 4A illustrates a respective incoming wafer of an example embodiment of the SEMP process module 10. In FIG. 3A, the incoming wafer has a patterned mandrel layer 210 comprising mandrel lines with ideally vertical sidewalls formed over a semiconductor substrate 200. In contrast, the respective incoming wafer in FIG. 4A illustrates a tapered mandrel layer 250 comprising patterned mandrel lines with tapered sidewalls.

Figure 3B:
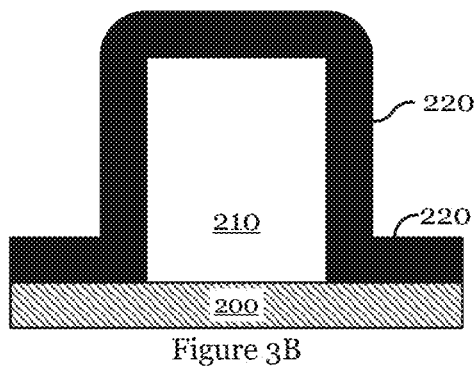
Figure 3C:
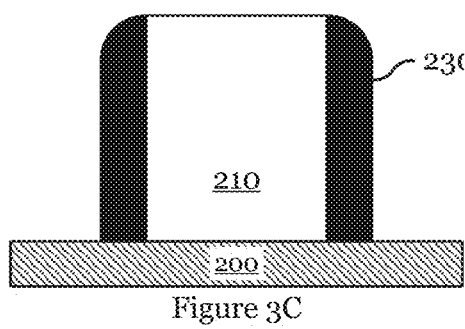

In FIG. 3B, a conformal spacer layer 220 is formed over the mandrel layer 210 and, in FIG. 3C, an anisotropic spacer open etch is performed to remove the spacer material from the horizontal surfaces, thereby forming sidewall spacers 230. The sidewalls of the conformal spacer layer 220 (in FIG. 3B) and the sidewall spacers 230 (in FIG. 3C) are also vertical since they follow the vertical edges of the mandrel layer 210. The patterned mandrel layer 210 is selectively removed in FIG. 3D, leaving behind a desired pattern of vertical spacers with spaces 240 in the places where the mandrels were present.

If the same process steps, described with reference to FIGS. 3B and 3C, were to be performed using the tapered mandrel layer 250, the edges of the respective spacers would conform to the tilt of the lines of the tapered mandrel layer 250. Accordingly, once the mandrels of the tapered mandrel layer 250 are removed, each pair of the remaining spacers that were formed on opposing sides of a line of the of the tapered mandrel layer 250 would be tilted towards each other in an inward direction into the space between them where the tapered mandrel layer 250 was present prior to its removal. As explained above, embodiments of the SEMP process module 10 provide the advantage of forming spacer etch masks with spacers having near-vertical edges despite starting with a patterned layer comprising a pattern of mandrel lines having undesirable tapered sidewalls. An example embodiment is described below with reference to FIGS. 4A-4E.

FIG. 4A illustrates a cross-sectional view of a semiconductor substrate 200 after coating a photoresist and patterning the photoresist to form photoresist lines of the tapered mandrel layer 250 having tapered sidewalls. In other embodiments, the material used for the sacrificial tapered mandrel layer 250 may comprise some other material such as silicon, silicon oxide, silicon nitride, titanium oxide, titanium nitride, or the like. In one embodiment, the surface of the semiconductor substrate may comprise silicon oxide formed, for example, by oxidizing the surface of a crystalline silicon wafer. In some other embodiments, the surface of the semiconductor substrate may be some other material such as silicon nitride, silicon carbide, compound semiconductor materials such as GaN, InP, InSb, GaAs, or a metal oxide.

The sidewall angle, θ, of the lines of the tapered mandrel layer 250 may be about 80°, in this example, and may be from about 70° to about 87° in various other embodiments. In one embodiment, the lines of the tapered mandrel layer 250 may be patterned at a dense pitch corresponding to the resolution limit of the photolithography system. In this example embodiment, the pitch of the mandrel layers 250 may be about 36 nm and the height of the photoresist mandrel of the tapered mandrel layer 250 may be about 95 nm. In various embodiments, the pitch may be from about 20 nm to about 100 nm, and the height may be from about 65 nm to about 1 m.

FIG. 4B illustrates a capped mandrel layer comprising a cap layer 260 formed over the tapered mandrel layer 250 using the DDD process. After completing the DDD cycles, a surface clean step may be performed to remove any capping material from over a portion of the surface of the semiconductor substrate 200 that is the floor of the region between adjacent mandrels, as described above with reference to FIGS. 1 and 2. In the example embodiment illustrated in FIG. 4B, the thickness of the cap layer 260 over the reference flat top surface of the line of the tapered mandrel layer 250 may be about 15 nm and may comprise titanium oxide. In various other embodiments, the respective thickness of the cap layer 260 may be from about 5 nm to about 30 nm, and may comprise silicon, silicon oxide, silicon nitride, titanium nitride, or the like. In some embodiments, the cap layer 260 may comprise the same material that has been used to form the tapered mandrel layer 250.

The DDD process used to deposit the titanium oxide of the cap layer 260 in this example embodiment has been implemented using the spatial ALD system 100, as described above with reference to FIG. 2. In this example, the adjustable processing parameters that may be used to adjust the depth-dependence of the deposition rate are the rotational speed of the rotating susceptor 130 and the composition of the first gaseous mixture comprising the first precursor gas in the first reaction zone 140 (see FIG. 2). In one embodiment, the rotational speed may be set at 60 rpm and the first precursor gas with no extra dilution of the first gaseous mixture used in the first reaction zone 140 (see FIG. 2). In various embodiments, the rotational speed may be set between 1 rpm and 240 rpm, and between 30 rpm and 500 rpm in one embodiment.

In one embodiment, using the spatial ALD system 100, the gaseous mixture in the first reaction zone 140 comprises the first precursor gas Tetrakis (DiMethylAmino) Titanium (TDMAT) mixed with argon as the carrier gas at flow rate of about 60 sccm and associated TDMAT transfer with a TDMAT ampoule temperature at about 40° C. The gaseous mixture in the second reaction zone comprises ozone at flow rates of about 6000 sccm at 300 g/m³ density. Other embodiments may use TriMethylAluminum (TMA) as the first precursor gas and oxygen plasma, as the second precursor gas. In one embodiment, the reaction temperature may be set to a low value of about 100° C. and 350° C. by controlling the temperature of the susceptor 130 on which the wafers 120 are loaded (see FIG. 2). In one embodiment, nitrogen is used to create the inert curtain in the isolation zones 150 and 180, as indicated in FIG. 2. The flow rate of nitrogen gas may be from about 1 sccm to about 4000 sccm. The pressure was maintained at about 1.6 Torr to about 2 Torr, for example, about 1.5 Torr.

In various embodiments of the SEMP process module 10, the flow rate of the first precursor carrier gas may be from about 10 sccm to about 1000 sccm. Also, in various embodiments, the flow rate of the second precursor (reactant) gas may be from about 6000 sccm to about 20000 sccm, and the flow rate of the respective nitrogen or argon carrier gas may be from about 1 sccm to about 20000 sccm. In various embodiments, the temperature may be controlled from room temperature to about 400° C., and the pressure may be controlled from about 1 Torr to about 2 Torr.

In one embodiment of the SEMP process module 10, the rotational speed of the rotating susceptor and the composition of the first gaseous mixture comprising the first precursor gas in the first reaction zone 140 were adjusted for the DDD process to adjust the depth-dependence of the deposition rate. In addition to these processing parameters, the total change in the sidewall angle, Δθ, would increase if the target thickness, $t_T$, is increased. An increase in the sidewall angle, Δθ, of about 5° to about 10° may be provided (depending on the height of the mandrel and the thickness of the deposited film) using the parameters described above for the example embodiment of the SEMP process module 10 in order to provide near-vertical edges of the capped mandrels comprising the cap layer 260 and the tapered mandrel layer 250, as illustrated in FIG. 4B.

Figure 4C:
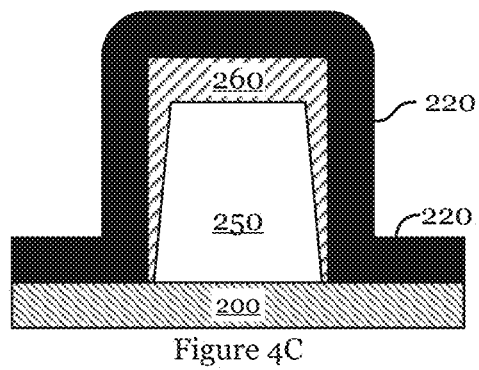

A spacer layer 220 may be formed conformally over the capped mandrel layer comprising the cap layer 260 and the tapered mandrel layer 250, as illustrated in FIG. 4C. In one embodiment, the spacer layer 220 may comprise silicon nitride having a thickness of about 4 nm to about 10 nm. Any suitable deposition technique may be used such as chemical vapor deposition (CVD), plasma-enhanced CVD (PECVD), or ALD, or the like. In various embodiments, the spacer layer 220 may comprise silicon oxide, silicon nitride, silicon oxynitride, silicon carbide, or metal oxides, or the like having a thickness from about 5 nm to about 30 nm, or more depending on the target pattern dimension. The materials selected for the surface of the semiconductor substrate 200, the tapered mandrel layer 250, the cap layer 260, and the spacer layer 220 may be such that the various etch processes used in the SEMP process module 10 are able to provide the etch selectivity required for the respective etch step.

Figure 4D:
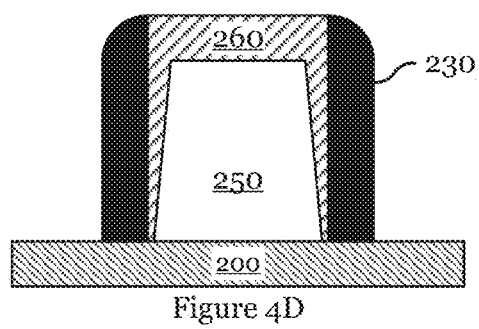
Figure 3D:
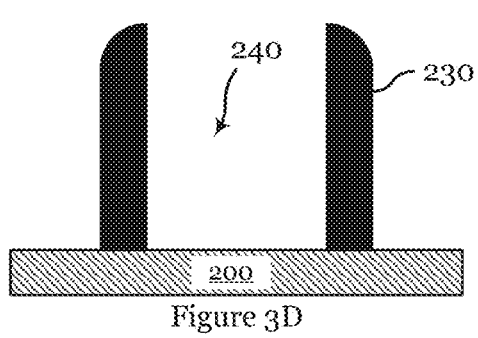

In FIG. 4D, the sidewall spacers 230 are formed by an anisotropic etch process using, for example, an RIE technique that selectively removes the silicon nitride from over the horizontal surfaces. As illustrated in FIG. 4D, the anisotropic etch process may expose the top surfaces of the cap layer 260 and the semiconductor substrate 200 while silicon nitride remains along the sidewalls of the capped mandrels comprising the cap layer 260 and the tapered mandrel layer 250. In some other embodiments, the anisotropic spacer open etch may remove the capping material from over the horizontal surfaces and expose the top surfaces of the tapered mandrel layer 250. The near-vertical edges of the capped mandrels are reflected in the near-vertical edges of the sidewall spacers 230.

Figure 4E:
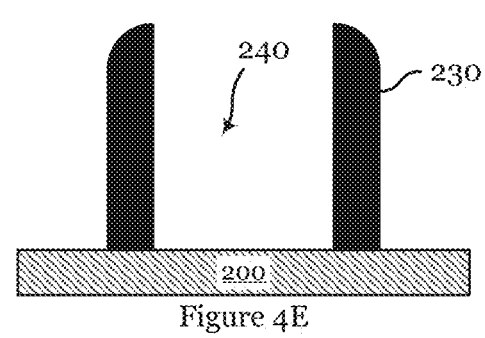

The mandrel pull in the example embodiment of the SEMP process module 10 is illustrated in FIG. 4E. The titanium oxide cap layer 260 may be removed by a plasma etch process that has suitable etch selectivity against sidewall spacers 230 and the semiconductor substrate 200, e.g., including an oxide layer, for example, by exposing the wafer to a chlorine plasma or chlorine-based plasma. Removal of the cap layer 260 may be followed by selective removal of the photoresist tapered mandrel layer 250 using any suitable etch process, for example, exposing the wafer to an oxygen plasma. In FIG. 4E, the spaces 240 vacated by removing the capped mandrels are shown flanked on each side by the sidewall spacers 230. The spacer pattern comprising the near-vertical sidewall spacers 230 in FIG. 4E is similar to the respective spacer pattern in the hypothetical flow described above with reference to FIG. 3D.

The results of an experiment, wherein various sidewall thickness profiles, $t_S(d)$ are obtained by varying the susceptor rotation speed and the first precursor concentration, are described with reference to FIG. 5. Various titanium oxide cap layers over tapered photoresist lines have been formed using the spatial ALD system 100, similar to the cap layer 260 over the tapered mandrel layer 250 in the above example embodiment. The two processing parameters that modulate the depth-dependence deposition rate of the respective DDD process, the susceptor rotation speed and the composition of the first gaseous mixture comprising the first precursor gas, have been varied to obtain titanium oxide cap layers with various sidewall thickness profiles, $t_S(d)$. The target thickness $t_T$ over the top surface of the lines has been kept fixed at $t_T=3$ nm to 12 nm.

Figure 5:
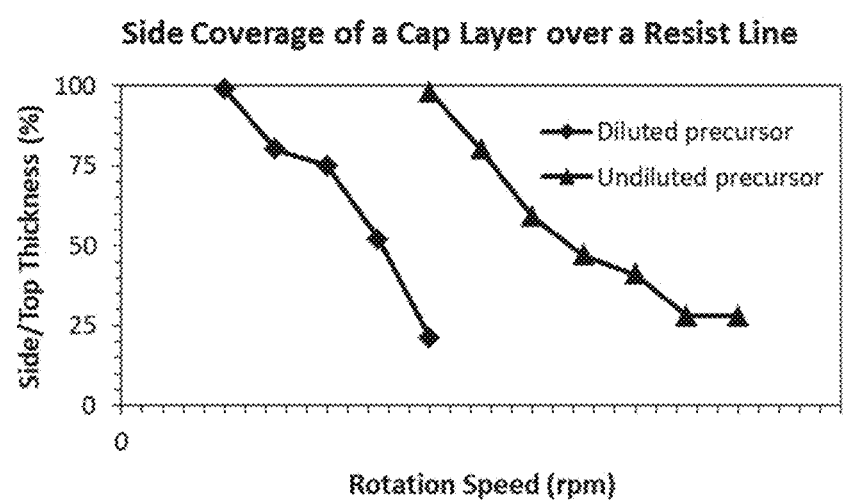
FIG. 5 is a graph illustrating side coverage of a cap layer vs. rotation speed, in accordance with an embodiment of the invention.

FIG. 5 illustrates a plot of a ratio $(t_S/t_T)$ vs. susceptor rotation speed for two different compositions of the first gaseous mixture comprising the first precursor gas. In FIG. 5, $t_S$ has been measured at a fixed depth. Two curves of $(t_S/t_T)$ vs. rotation speed are shown corresponding to the two different concentrations of the first precursor gas. For the curve labeled "undiluted precursor" the composition of the first gaseous mixture roughly matches the respective composition used in the example embodiment of the SEMP process module 10, described with reference to FIGS. 4A-4E. In the other curve, the concentration of the first precursor has been diluted by increasing the flow rate of nitrogen from 2 slm to 4 slm.

In both curves in FIG. 5, $(t_S/t_T)$ at the fixed depth may be reduced from 100% at the top (d=0 nm) to between 20% and 30% at the fixed depth by increasing the rotation speed beyond a threshold speed. Diluting the first precursor gas reduces the downward flux of the precursor chemical; hence, the threshold rotation speed is shifted down. As the rotation speed is increased beyond the threshold rotation speed, the ratio $(t_S/t_T)$ reduces progressively to about 30% for the undiluted first precursor gas and to about 20% for the diluted first precursor gas.

Process characterization data such as the data displayed in the curves plotted in FIG. 5 may be collected from a plurality of experimental wafers. The characterization data may be analyzed to extract a relationship between $t_S(d)$ and selected parameters of the DDD process such as rotational speed of the susceptor, precursor concentration in the gaseous mixture, and the target thickness. The relationship may be recorded graphically or as a numerical model in tabular, mathematical, or some other form and used subsequently to configure a spatial ALD system to perform a DDD process to help achieve a targeted sidewall thickness profile, $t_S(d)$, and sidewall angle $\Theta$.

Example embodiments of a deposition method have been described for forming a cap layer having a controlled nonuniform, depth-dependent thickness of the capping material formed along the sloped sidewalls of patterned features. The vertically nonuniform thickness profile, $t_S(d)$, (where d is the depth from the top surface of the feature) is achieved with a controlled vertically nonuniform deposition rate of the DDD process, wherein the deposition rate at a depth, d, reduces with increasing d. The vertical nonuniformity of the deposition rate reflects the nonuniformity of a vertically decreasing concentration profile of the precursor gases along the sidewalls.

The method by which the DDD process achieves such a concentration profile is using a cyclic deposition loop where, in one cycle, the precursor species diffuse a limited distance downwards from the top towards the floor of patterned features. The DDD processes described above are performed on incoming patterned wafers loaded onto a rotating susceptor in a spatial ALD tool. One revolution of the susceptor is one cycle of the DDD process loop during which the susceptor moves the wafers rapidly through two reaction zones containing gaseous mixtures of reactant and carrier gases and are isolated on either side by inert gas isolation curtains. An average diffusion distance of the precursors downwards along the sidewalls depends on the diffusion time and an average diffusion velocity, both of which may be controlled by selecting appropriate independent processing parameters. In the embodiments described above, the diffusion time in one cycle has been controlled by controlling the rotational speed of the susceptor, and the diffusion velocity has been modulated by adjusting the concentration of the precursor gas in the gaseous mixture in the first reaction zone. These two parameters may be controlled to adjust the ratio of the cap thickness on the sidewall at a depth, d, to that close to the top surface, $(t_S(d)/t_S(0))$. The difference between these two thicknesses, given by $\Delta t_S(d)=(t_S(d)-t_S(0))$ is roughly proportional to the target thickness for the top surface $t_T$. Accordingly, a desired thickness profile, $t_S(d)$, may be obtained by controlling four process parameters of the DDD process implemented in a spatial ALD tool: precursor chemistry, rotational speed of the susceptor, precursor concentration in the gaseous mixture, and the target thickness.

In the example embodiment, precursor concentration in a gaseous mixture is used as the adjustable parameter for the diffusion velocity of the respective precursor. However, it is understood that some other parameter may be used, for example, the temperature of the gaseous mixture. Also, although a constant rotational speed has been used, it is possible to alter the rpm at which the susceptor rotates at different times during the DDD loop to further adjust the thickness profile of the cap layer.

In the example flow diagram for the SEMP process module 10 (see FIG. 1), the DDD process loop has been implemented as an ALD loop, wherein one cycle (box 20) of the DDD process loop (box 17) comprises two separate self-limiting surface reactions using two different precursors, same as is done in one reaction cycle of an ALD loop. As explained above, in the example embodiment, the time duration set for one revolution of the susceptor does not provide sufficient reaction time for complete coverage of the sidewall surface with one atomic layer of the capping material in one cycle of the example DDD process. It is thereby understood that alternate embodiments of the DDD may be realized, wherein the precursor concentration profile is vertically nonuniform but the deposition reaction may not comprise a plurality of self-limiting sub-reactions, as is the case in an ALD reaction cycle. For example, one cycle of the DDD loop, as shown in FIG. 1 box 20, may be modified replacing the ALD reaction cycle comprising blocks 22, 24, 26, and 28 with one deposition reaction and one inert gas purge or pass through an inert gas curtain.

Figure 6:
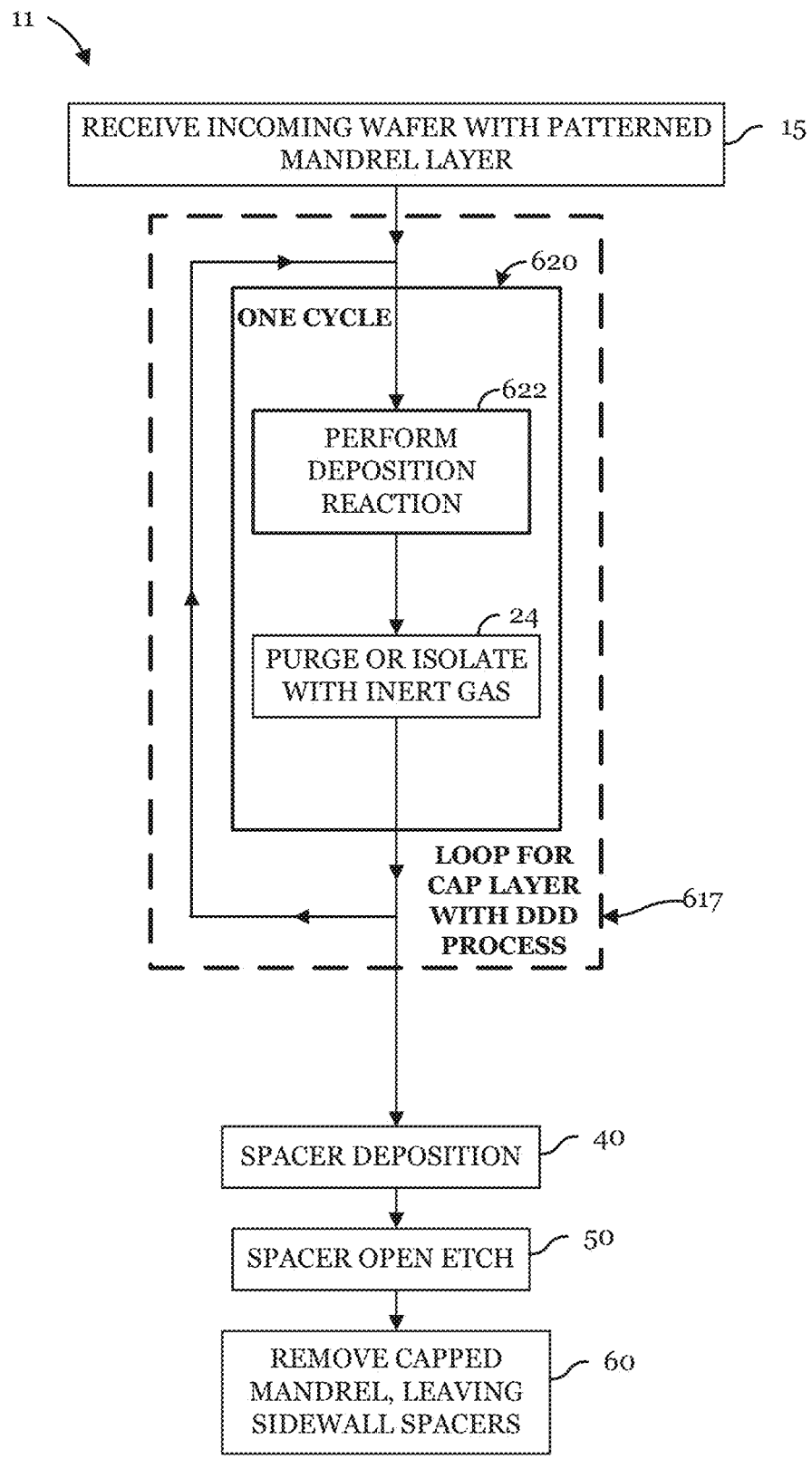
FIG. 6 is a flow diagram of a spacer etch mandrel pull process module, in accordance with an embodiment of the invention.

FIG. 6 illustrates a flow diagram for an alternate SEMP module 11 that has been modified from the flow diagram for the SEMP process module 10 in FIG. 1 by replacing the ALD reaction cycle (box 20 in FIG. 1) with the alternate cycle mentioned above. As illustrated in FIG. 6 box 620, one cycle of the DDD process used in the SEMP module 11 comprises performing one deposition reaction (block 622) and one inert gas purge or pass through an inert gas curtain (block 24). The gaseous mixture for the deposition reaction performed in block 622 may be similar to the respective non self-limiting deposition reaction used for a CVD process used to deposit the capping material. The residual reactants and by products may be removed from the wafer during the following inert gas purge or inert gas isolation step performed in block 24, similar to the respective purge or isolation step in the DDD process used in the SEMP process module 10 illustrated in FIG. 1.

The DDD process used in the SEMP module 11 may be executed using a spatial ALD tool similar to the spatial ALD system 100, described above with reference to FIG. 2. For example, in one embodiment, the spatial ALD system 100 may be configured such that the same gaseous mixture comprising the reactants and carrier gases for the respective CVD process is used in both the reaction zones 140 and 160. In this configuration, during one revolution of the susceptor 130, two of the cycles (box 21 in FIG. 6) of the DDD process loop (dashed box 617 in FIG. 6) are executed as each wafer 120 passes through both the reaction zones 140 and 160. In another embodiment, the deposition reaction may be confined to one of the two reaction zones, for example, the first reaction zone 140, and a non-reactive or inert gaseous mixture may be used in the other reaction zone. In that configuration, one ALD reaction cycle is executed on a wafer 120 during one revolution of the susceptor 130. A vertically nonuniform reactant concentration profile may be created using the same method as for the example embodiment of the SEMP process module 10 described above, for example, by adjusting the rotational speed of the susceptor 130 and the reactant concentration in the gaseous mixtures in the reaction zones used to deposit the capping material.

Figure 7:
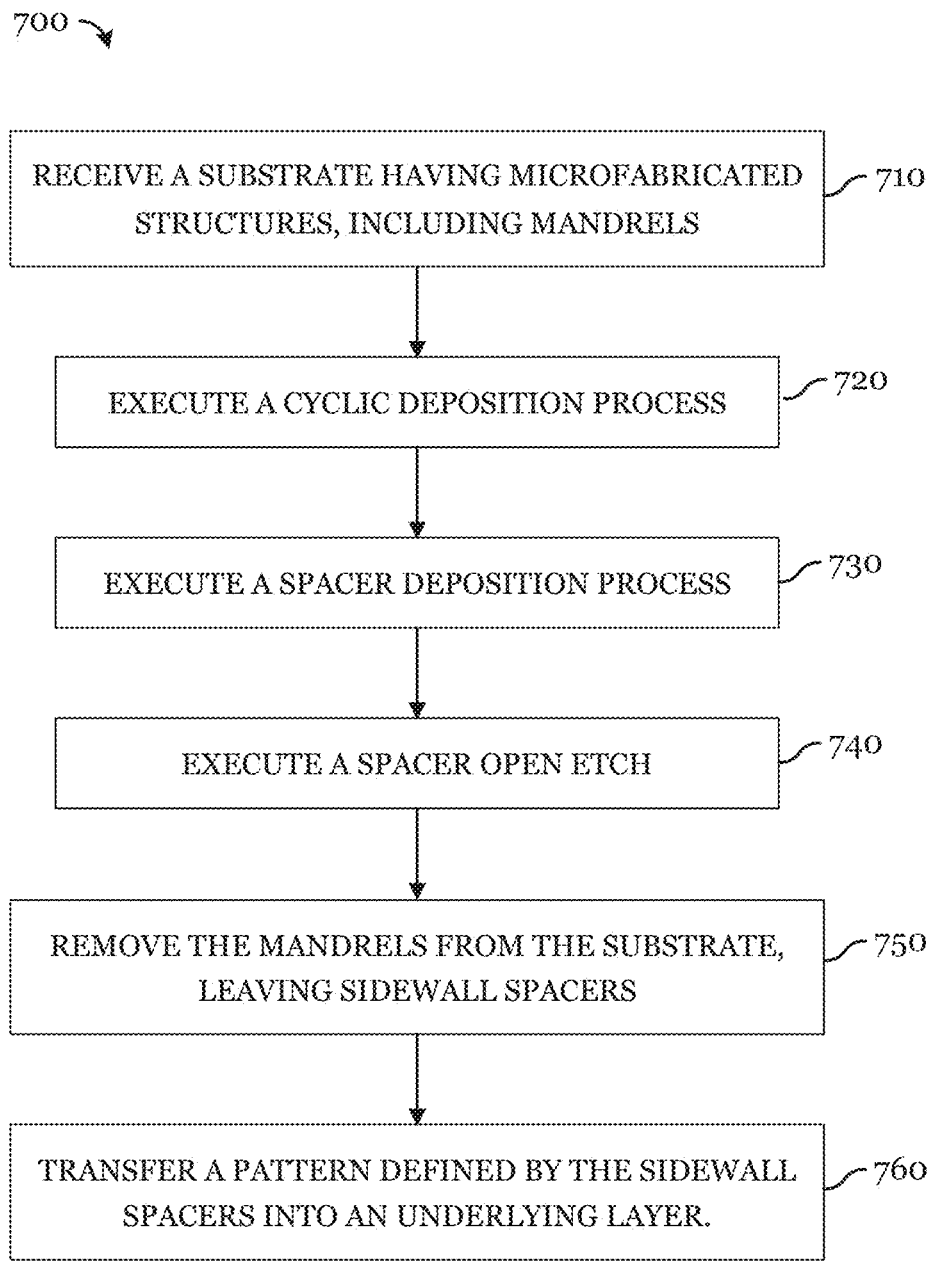
FIG. 7 is a flow diagram of a sidewall image transfer process module, in accordance with an embodiment of the invention.

FIG. 7 illustrates a flow diagram of an SIT double patterning method 700 of patterning a layer of a substrate. As indicated by block 710, the method starts with receiving a substrate having microfabricated structures, including mandrels. The next block 720 is executing a deposition process that deposits a first material on the mandrels, the deposition process including cyclically moving the substrate through a set of deposition modules, the set of deposition modules including modules for component process of the atomic layer deposition process, wherein the substrate is moved through the set of atomic layer deposition modules so that the first material is deposited at a first thickness at top portions of the mandrels and at a second thickness at bottom portions of mandrels, the first thickness being greater than the second thickness. The deposition process may be, for example, as previously described using FIGS. 1-6. In various embodiments, the first thickness is at least 10% thicker as compared to the second thickness. As described in various embodiments, the difference between the first thickness and the second thickness is varied by changing the rotational speed of the susceptor on which the substrate is held, changing the dilution of the precursor gas, e.g., by changing the flow of nitrogen or argon, e.g., from 1 slm to 10 slm, particularly between 2 slm and 4 slm, changing the target thickness of the deposition process, changing the precursor chemistry, for example, by changing the first chemical reaction of the cyclic process.

After completing the cyclic deposition process (block 720), in block 730, the method includes executing a spacer deposition process that conformally deposits a second material on the substrate. For example, this is described using FIG. 4C. Then, in block 740, the method includes executing a spacer open etch that removes depositions of the second material over a top surface of the mandrels. For example, this is described using FIG. 4D. Once the spacers are formed, the subsequent steps are removing the mandrels from the substrate, leaving sidewall spacers, as indicated by block 750, for example, this is described using FIG. 4E. Accordingly, the successive execution of blocks 710, 720, 730, 740 and 750 may be done using either the SEMP process module 10 (illustrated in FIG. 1) or the SEMP module 11 (illustrated in FIG. 6). The patterned layer of spacers (e.g., sidewall spacer 230 in FIG. 4E) may be used as the patterned masking layer in the SIT double patterning method 700 in block 760. The processing in block 760 is transferring a pattern defined by the sidewall spacers into an underlying layer.

As explained above, embodiments of a DDD process may be used advantageously to achieve high fidelity pattern transfer in multiple patterning, for example, the double patterning method 700.

Figure 8:
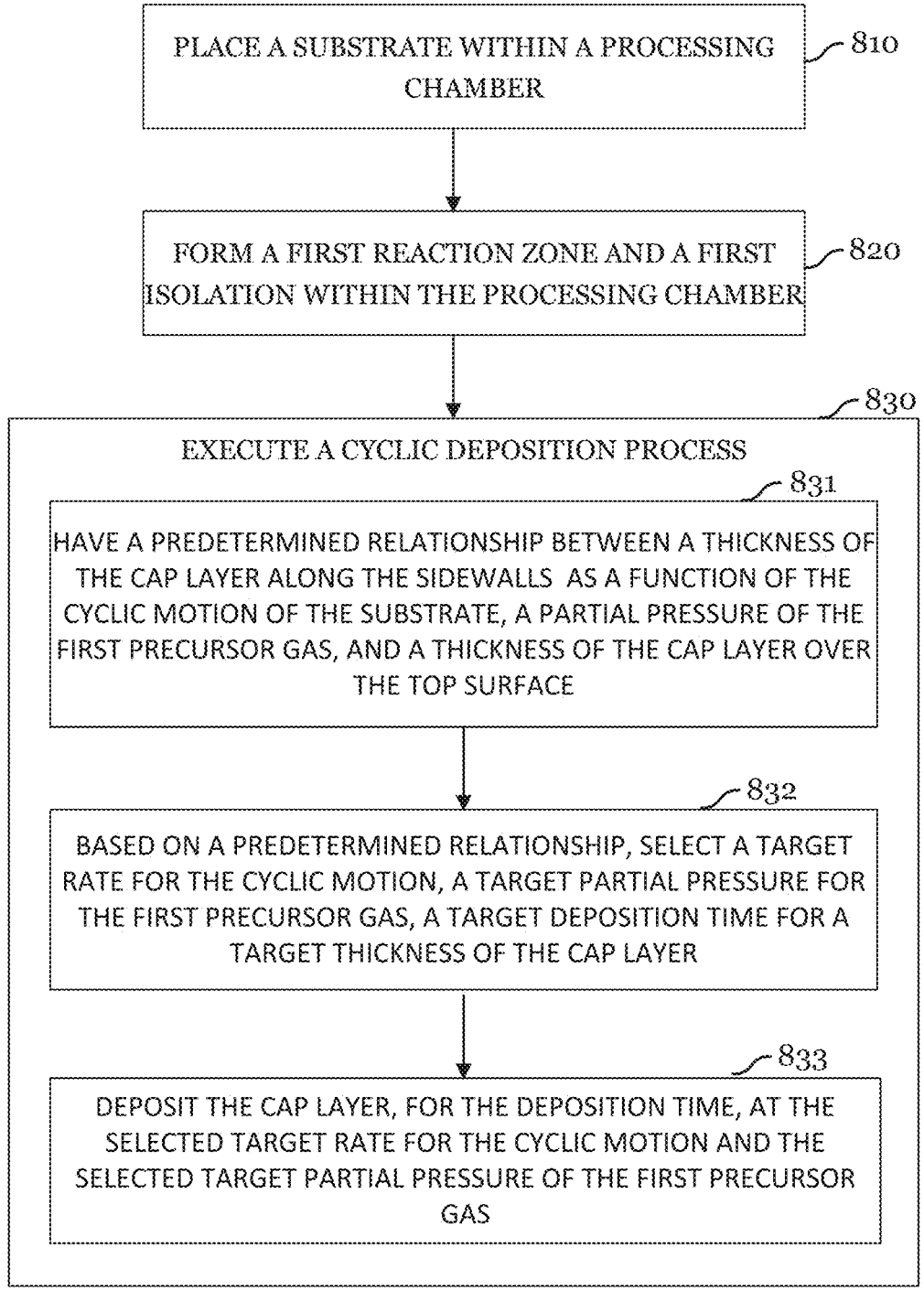
FIG. 8 is a flow diagram of a depth-dependent deposition process, in accordance with an embodiment of the invention.

The embodiments of DDD processes described in this disclosure follow a method illustrated in the flow diagram in FIG. 8.

The DDD process is initiated by placing a substrate within a processing chamber, the substrate comprising a microfabricated structure comprising sidewalls and a top surface, as indicated in block 810. The processing chamber is configured by forming a first reaction zone within the processing chamber (block 820) by flowing a first gaseous mixture comprising a first precursor gas, and forming a first isolation zone within the processing chamber (also in block 820) by flowing an inert gas through the first isolation zone. The DDD process is then performed in block 830 by executing a cyclic deposition process by depositing a cap layer comprising a first material over the sidewalls and the top surface of the microfabricated structure by moving the substrate within the processing chamber cyclically through the first reaction zone and the first isolation zone, wherein a first thickness of the cap layer at the top surface is greater than a second thickness of the cap layer at the sidewalls. Executing the cyclic deposition process may be, for example, as previously described using FIGS. 1-6. As also further illustrated in FIG. 8 in block 831, this cyclic deposition process may include having a predetermined relationship between a thickness of the cap layer along the sidewalls of the microfabricated structure as a function of the cyclic motion of the substrate, a partial pressure of the first precursor gas in the first reaction zone, and a thickness of the cap layer over the top surface of the microfabricated structure. The predetermined relationship is extracted from process characterization data. An example of process characterization data that may be used in extracting this relationship is described using FIG. 5. As illustrated in block 832, based on the predetermined relationship, the method may select a target rate for the cyclic motion, a target partial pressure for the first precursor gas, and a target deposition time for a target thickness of the cap layer over the top surface of the microfabricated structure. Once these parameters are selected to achieve a target thickness, the cap layer is deposited by performing the cyclic deposition process for the deposition time, at the selected target rate for the cyclic motion and the selected target partial pressure of the first precursor gas (block 833). Executing the cyclic deposition process may be, for example, as previously described using FIGS. 1-6.

Example 1

A method of patterning a substrate, the method including: receiving a substrate having microfabricated structures, including mandrels; executing a deposition process that deposits a first material on the mandrels, the deposition process including cyclically moving the substrate through a set of deposition modules, the set of deposition modules including modules for component process of the deposition process, where the substrate is moved through the set of deposition modules so that the first material is deposited at a first thickness at top portions of the mandrels and at a second thickness at bottom portions of mandrels, the first thickness being greater than the second thickness; executing a spacer deposition process that conformally deposits a second material on the substrate; executing a spacer open etch that removes depositions of the second material from over a top surface of the mandrels; removing the first material and the mandrels from the substrate, leaving sidewall spacers; and transferring a pattern defined by the sidewall spacers into an underlying layer after removing the first material and the mandrels from the substrate.

Example 2

The method of example 1, further including performing a selective etch process after executing the spacer open etch, where the selective etch process removes the first material and the mandrels from the substrate without damaging the sidewall spacers.

Example 3

The method of one of examples 1 or 2, where receiving the substrate includes loading the substrate on a susceptor disposed within a processing chamber, and where the substrate is moved by rotating the susceptor at a rotational speed greater than 30 revolutions per minute.

Example 4

A method of patterning a substrate, the method including: receiving a substrate having microfabricated structures including mandrels; executing an atomic layer deposition process that deposits a first material on the mandrels, the atomic layer deposition process including cyclically moving the substrate through a set of atomic layer deposition modules, the set of atomic layer deposition modules including modules for component process of the atomic layer deposition process, where the substrate is moved through the set of atomic layer deposition modules at a speed that results in the first material being deposited at a first thickness at top portions of the mandrels and at a second thickness a bottom portions of mandrels, the first thickness being greater than the second thickness; executing a spacer deposition process that conformally deposits a second material on the first material; executing a spacer open anisotropic etch to remove depositions of the second material from over top surfaces of the mandrels; and removing the first material and the mandrels from the substrate, leaving sidewall spacers; and transferring a pattern defined by the sidewall spacers into an underlying layer.

Example 5

The method of example 4, where the first thickness is at least 10% thicker as compared to the second thickness, where the atomic layer deposition process is performed at a temperature between 100° C. and 350° C.

Example 6

The method of one of examples 4 or 5, further including controlling a sidewall angle of the sidewall spacers between 89° and 91° by controlling the difference between the first thickness and the second thickness.

Example 7

The method of one of examples 4 to 6, where receiving the substrate includes loading the substrate on a susceptor to execute the atomic layer deposition process; and where moving the substrate includes rotating the susceptor at a rotational speed between 30 revolutions per minute and 500 revolutions per minute to control a difference between the first thickness and the second thickness.

Example 8

The method of one of examples 4 to 7, where the set of atomic layer deposition modules includes a first reaction module, further including diluting a first gaseous mixture including a first precursor gas by nitrogen gas or argon gas to control the difference between the first thickness and the second thickness.

Example 9

A method for forming a device, the method including: placing a substrate within a processing chamber, the substrate including a microfabricated structure including sidewalls and a top surface; forming a first reaction zone within the processing chamber by flowing a first precursor gas and a first isolation zone within the processing chamber by flowing an inert gas through the first isolation zone; and executing a cyclic deposition process to deposit a cap layer including a first material over the sidewalls and the top surface of the microfabricated structure by cyclically moving the substrate in a cyclic motion within the processing chamber through the first reaction zone and the first isolation zone, the depositing including having a predetermined relationship between a thickness of the cap layer along the sidewalls of the microfabricated structure with the first precursor gas, the cyclic motion of the substrate, a partial pressure of the first precursor gas in the first reaction zone, and a thickness of the cap layer over the top surface of the microfabricated structure, based on the predetermined relationship, selecting the first precursor gas, a target rate for the cyclic motion, a target partial pressure for the first precursor gas, a target deposition time for a target thickness of the cap layer over the top surface of the microfabricated structure, and depositing the cap layer, for the selected target deposition time, at the selected target rate for the cyclic motion and the selected target partial pressure of the first precursor gas.

Example 10

The method of example 9, where the sidewalls include top portions proximate the top surface and bottom portions separated from the top surface by the top portions, and where depositing the cap layer includes depositing, during each pass of the cyclic motion, more of the first material on the top portions of the sidewalls than the bottom portions of the sidewalls.

Example 11

The method of one of examples 9 or 10, further including: forming a second reaction zone within the processing chamber by flowing a second precursor gas through the second reaction zone; forming a second isolation zone within the processing chamber by flowing the inert gas through the second isolation zone; and where depositing the cap layer further includes converting an intermediate layer formed by the first precursor gas in the first reaction zone to the first material in the second reaction zone by cyclically moving the substrate in a cyclic motion within the processing chamber through the second reaction zone and the second isolation zone.

Example 12

The method of one of examples 9 to 11, where the pressure in the first reaction zone is between 1.6 Torr and 2 Torr, where the first precursor gas in the first reaction zone is Tetrakis (DiMethylAmino) Titanium (TDMAT), where a source of the TDMAT is maintained at a temperature between 30° C. and 50° C.

Example 13

The method of one of examples 9 to 12, further including: when the microfabricated structure is within the first reaction zone, depositing the first material over the sidewalls and the top surface of the microfabricated structure; when the microfabricated structure is within the first isolation zone, purging the first precursor gas from the sidewalls and the top surface of the microfabricated structure; and when the microfabricated structure is within the first isolation zone removing a byproduct formed during the depositing.

Example 14

The method of one of examples 9 to 13, where one cycle of the cyclic deposition process is performed with each pass of the cyclic motion of the substrate.

Example 15

The method of one of examples 9 to 14, where one cycle of the cyclic deposition process is performed with each pass of the cyclic motion of the substrate.

Example 16

The method of one of examples 9 to 15, where depositing a capping layer includes, depositing a fraction of a complete monolayer of the cap layer during each pass of the cyclic motion of the substrate, and where, after the deposition of the cap layer, a first thickness of the cap layer at the top surface is greater than a second thickness of the cap layer at the sidewalls.

Example 17

The method of one of examples 9 to 16, where placing the substrate includes loading the substrate on a circular susceptor disposed within the processing chamber; and where moving the substrate includes rotating the susceptor.

Example 18

The method of one of examples 9 to 17, where the susceptor is rotated at a rotational speed between 1 revolutions per minutes and 240 revolutions per minute.

Example 19

The method of one of examples 9 to 18, where placing the substrate includes loading the substrate on an oscillating susceptor disposed within the processing chamber; and where moving the substrate includes oscillating the susceptor in a bidirectional motion.

Example 20

The method of one of examples 9 to 19, further including: patterning a photoresist to form a mandrel including the microfabricated structure; forming spacers on sidewalls of the cap layer; and removing the microfabricated structure to form a mask.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A method of patterning a substrate, the method comprising:
receiving a substrate having microfabricated structures, including mandrels;
executing a deposition process that deposits a first material on the mandrels, the deposition process including cyclically moving the substrate through a set of deposition modules, the set of deposition modules including modules for component process of the deposition process, wherein the substrate is moved through the set of deposition modules so that the first material is deposited at a first thickness at top portions of the mandrels and at a second thickness at bottom portions of mandrels, the first thickness being greater than the second thickness; and
executing a spacer deposition process that conformally deposits a second material on the substrate.

2. The method of claim 1, further comprising:
executing a spacer open etch that removes depositions of the second material from over a top surface of the mandrels;
removing the first material and the mandrels from the substrate, leaving sidewall spacers; and
transferring a pattern defined by the sidewall spacers into an underlying layer after removing the first material and the mandrels from the substrate.

3. The method of claim 1, further comprising:
performing a selective etch process after executing the spacer open etch, wherein the selective etch process removes the first material and the mandrels from the substrate without damaging the sidewall spacers; and
wherein receiving the substrate comprises loading the substrate on a susceptor disposed within a processing chamber, and wherein the substrate is moved by rotating the susceptor at a rotational speed greater than 30 revolutions per minute.

4. A method of patterning a substrate, the method comprising:
receiving a substrate having microfabricated structures including mandrels;
executing an atomic layer deposition process that deposits a first material on the mandrels, the atomic layer deposition process including cyclically moving the substrate through a set of atomic layer deposition modules, the set of atomic layer deposition modules including modules for component process of the atomic layer deposition process, wherein the substrate is moved through the set of atomic layer deposition modules at a speed that results in the first material being deposited at a first thickness at top portions of the mandrels and at a second thickness a bottom portions of mandrels, the first thickness being greater than the second thickness;
executing a spacer deposition process that conformally deposits a second material on the first material;
executing a spacer open anisotropic etch to remove depositions of the second material from over top surfaces of the mandrels; and
removing the first material and the mandrels from the substrate, leaving sidewall spacers; and
transferring a pattern defined by the sidewall spacers into an underlying layer.

5. The method of claim 4, wherein the first thickness is at least 10% thicker as compared to the second thickness, wherein the atomic layer deposition process is performed at a temperature between 100° C. and 350° C.

6. The method of claim 4, further comprising controlling a sidewall angle of the sidewall spacers between 89° and 91° by controlling a difference between the first thickness and the second thickness.

7. The method of claim 4,
wherein receiving the substrate comprises loading the substrate on a susceptor to execute the atomic layer deposition process; and
wherein moving the substrate comprises rotating the susceptor at a rotational speed between 1 revolutions per minute and 240 revolutions per minute to control a difference between the first thickness and the second thickness.

8. The method of claim 4, wherein the set of atomic layer deposition modules comprises a first reaction module, further comprising
diluting a first gaseous mixture comprising a first precursor gas by nitrogen gas or argon gas to control the difference between the first thickness and the second thickness.

9. A method for forming a device, the method comprising:
placing a substrate within a processing chamber, the substrate comprising a microfabricated structure comprising sidewalls and a top surface;
forming a first reaction zone within the processing chamber by flowing a first precursor gas and a first isolation zone within the processing chamber by flowing an inert gas through the first isolation zone; and
executing a cyclic deposition process to deposit a cap layer comprising a first material over the sidewalls and the top surface of the microfabricated structure by cyclically moving the substrate in a cyclic motion within the processing chamber through the first reaction zone and the first isolation zone, the depositing comprising
having a predetermined relationship between a thickness of the cap layer along the sidewalls of the microfabricated structure with the first precursor gas, the cyclic motion of the substrate, a partial pressure of the first precursor gas in the first reaction zone, and a thickness of the cap layer over the top surface of the microfabricated structure,
based on the predetermined relationship, selecting the first precursor gas, a target rate for the cyclic motion, a target partial pressure for the first precursor gas, a target deposition time for a target thickness of the cap layer over the top surface of the microfabricated structure, and
depositing the cap layer, for the selected target deposition time, at the selected target rate for the cyclic motion and the selected target partial pressure of the first precursor gas.

10. The method of claim 9, wherein the sidewalls comprise top portions proximate the top surface and bottom portions separated from the top surface by the top portions, and wherein depositing the cap layer comprises depositing, during each pass of the cyclic motion, more of the first material on the top portions of the sidewalls than the bottom portions of the sidewalls.

11. The method of claim 9, further comprising:
forming a second reaction zone within the processing chamber by flowing a second precursor gas through the second reaction zone;
forming a second isolation zone within the processing chamber by flowing the inert gas through the second isolation zone; and
wherein depositing the cap layer further comprises converting an intermediate layer formed by the first precursor gas in the first reaction zone to the first material in the second reaction zone by cyclically moving the substrate in a cyclic motion within the processing chamber through the second reaction zone and the second isolation zone.

12. The method of claim 11, wherein the pressure in the first reaction zone is between 1.6 Torr and 2 Torr, wherein the first precursor gas in the first reaction zone is Tetrakis (DiMethylAmino) Titanium (TDMAT), wherein a source of the TDMAT is maintained at a temperature between 30° C. and 50° C.

13. The method of claim 9, further comprising:
when the microfabricated structure is within the first reaction zone, depositing the first material over the sidewalls and the top surface of the microfabricated structure;
when the microfabricated structure is within the first isolation zone, purging the first precursor gas from the sidewalls and the top surface of the microfabricated structure; and
when the microfabricated structure is within the first isolation zone removing a byproduct formed during the depositing.

14. The method of claim 13, wherein one cycle of the cyclic deposition process is performed with each pass of the cyclic motion of the substrate.

15. The method of claim 9, wherein one cycle of the cyclic deposition process is performed with each pass of the cyclic motion of the substrate.

16. The method of claim 9, wherein depositing a capping layer comprises, depositing a fraction of a complete monolayer of the cap layer during each pass of the cyclic motion of the substrate, and wherein, after the deposition of the cap layer, a first thickness of the cap layer at the top surface is greater than a second thickness of the cap layer at the sidewalls.

17. The method of claim 9,
wherein placing the substrate comprises loading the substrate on a circular susceptor disposed within the processing chamber; and
wherein moving the substrate comprises rotating the susceptor.

18. The method of claim 17, wherein the susceptor is rotated at a rotational speed between 1 revolutions per minutes and 240 revolutions per minute.

19. The method of claim 9,
wherein placing the substrate comprises loading the substrate on an oscillating susceptor disposed within the processing chamber; and
wherein moving the substrate comprises oscillating the susceptor in a bidirectional motion.

20. The method of claim 9, further comprising:
patterning a photoresist to form a mandrel comprising the microfabricated structure;
forming spacers on sidewalls of the cap layer; and
removing the microfabricated structure to form a mask.

* * * * *